(12) United States Patent
Chen et al.

(10) Patent No.: US 8,772,062 B2
(45) Date of Patent: Jul. 8, 2014

(54) METHOD FOR MANUFACTURING LIGHT EMITTING DIODE PACKAGE HAVING LED DIE FIXED BY ANISOTROPIC CONDUCTIVE PASTE

(71) Applicant: Advanced Optoelectronic Technology, Inc., Hsinchu Hsien (TW)

(72) Inventors: Lung-Hsin Chen, Hsinchu (TW); Wen-Liang Tseng, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/786,354

(22) Filed: Mar. 5, 2013

(65) Prior Publication Data

US 2013/0288406 A1  Oct. 31, 2013

(30) Foreign Application Priority Data

Apr. 27, 2012 (CN) .......................... 2012 1 0127582

(51) Int. Cl.
*H01L 33/62* (2010.01)
*H01L 33/00* (2010.01)

(52) U.S. Cl.
CPC ............ *H01L 33/62* (2013.01); *H01L 33/0095* (2013.01); *H01L 2933/0066* (2013.01)
USPC ....................................................... 438/27

(58) Field of Classification Search
CPC ....... H01L 33/486; H01L 33/62; H01L 33/52; H01L 33/005; H01L 33/54; H01L 33/60; H01L 2224/48091; H01L 2224/97; H01L 2224/73265; H01L 2224/32225; H01L 2224/83; H01L 2924/00; H01L 2924/12041; H01L 2924/00014; H01L 24/97; H01L 25/0753
See application file for complete search history.

(56) References Cited

U.S. PATENT DOCUMENTS

| | | | |
|---|---|---|---|
| 5,645,707 A * | 7/1997 | Omoto ......................... | 205/114 |
| 7,976,750 B2 * | 7/2011 | Burmeister et al. ......... | 264/46.5 |
| 2005/0218801 A1 * | 10/2005 | Hon et al. ..................... | 313/512 |
| 2007/0205425 A1 * | 9/2007 | Harada ............................ | 257/98 |
| 2007/0262338 A1 * | 11/2007 | Higashi et al. ................. | 257/99 |
| 2009/0152665 A1 * | 6/2009 | Tseng et al. .................. | 257/461 |
| 2011/0068358 A1 * | 3/2011 | Kuo et al. ........................ | 257/98 |
| 2011/0256646 A1 * | 10/2011 | Lin ................................. | 438/27 |
| 2011/0266578 A1 * | 11/2011 | Kanisawa et al. .............. | 257/98 |
| 2012/0086041 A1 * | 4/2012 | Isogai ............................. | 257/99 |
| 2012/0175660 A1 * | 7/2012 | Namiki et al. .................. | 257/98 |
| 2012/0248481 A1 * | 10/2012 | Seo ................................. | 257/98 |

* cited by examiner

*Primary Examiner* — Zandra Smith
*Assistant Examiner* — Sophia Nguyen
(74) *Attorney, Agent, or Firm* — Novak Druce Connolly Bove + Quigg LLP (57) ABSTRACT

A method for packaging an LED, includes steps: providing a substrate and forming a plurality of pairs of electrodes on the substrate; positioning anisotropic conductive pastes on the substrate and attaching each anisotropic conductive paste to each pair of the electrodes; positioning an LED die on each anisotropic conductive paste and electrically connecting each LED die to each corresponding pair of the electrodes with the anisotropic conductive paste by hot compressing; forming an encapsulation on the substrate to cover the LED dies; and cutting the substrate to obtain individual LED packages.

14 Claims, 12 Drawing Sheets

METHOD FOR MANUFACTURING LIGHT EMITTING DIODE PACKAGE HAVING LED DIE FIXED BY ANISOTROPIC CONDUCTIVE PASTE

BACKGROUND

1. Technical Field

The present disclosure generally relates to methods for manufacturing LED (light emitting diode) packages, and particularly to a method for manufacturing an LED package which has an LED die fixed to a substrate by anisotropic conductive paste.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

A common LED includes a substrate, electrodes formed on the substrate, an LED die arranged on the substrate and electrically connected to the electrodes, and an encapsulation covering the LED die. The LED die has electrodes formed thereon.

In common packaging process of LEDs, the LED die is assembled to the substrate by flip chip bonding, wire bonding or eutectic bonding. In the flip chip bonding, solder balls of the LED die which are adhered to the electrodes of the LED die are arranged facing the substrate and electrically connected to the electrodes formed on the substrate by a reflow process. In the wire bonding, gold wires are used to electrically connect the electrodes of the LED die and the substrate. In eutectic bonding, eutectic alloy is used to electrically connect the electrodes of the LED and the substrate. However, a size of the common LED package is so small that mechanical operation, such as the wire bonding, relating to the LED die can not be conveniently performed in the narrow space of the small LED package. The LED die must be wire bonded to the electrodes under careful operations and strict controls, which incurs a higher cost. The flip chip bonding and the eutectic bonding will cause heat stress in the electrical connections of the LED package, which adversely affects the reliability of the LED package.

Therefore, what is needed is to provide a method of manufacturing an LED package which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packages, and a method for making the LED packages, in detail.

Figure 1:
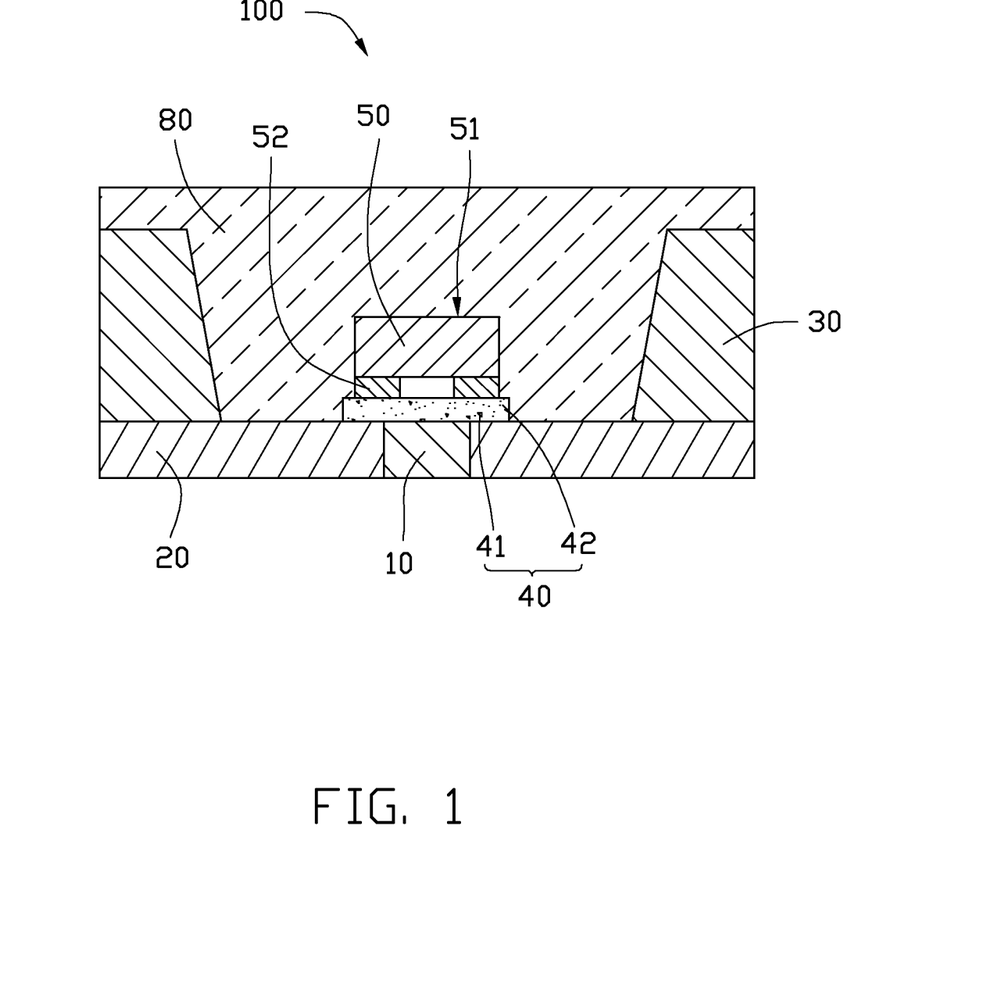
FIG. 1 is a schematic, cross-sectional view of an LED package obtained by an LED packaging method in accordance with an embodiment of the present disclosure.

Referring to FIG. 1, an LED package 100 obtained by an LED packaging method in accordance with an embodiment of the present disclosure is illustrated. The LED package 100 includes a substrate 10, a pair of electrodes 20, an LED die 50, and an encapsulation 80. The electrodes 20 are formed on the substrate 10. The LED die 50 is mounted on the substrate 10 and electrically connected to the electrodes 20. The encapsulation 80 covers the LED die 50 on the substrate 10.

The LED die 50 is a flip chip which is arranged on the substrate 10 with two electrodes 52 of the LED die 50 facing downwardly toward the substrate 10. The LED die 50 includes a light outputting surface 51 opposite the bottom surface of the LED die 50 where the two electrodes 52 are located. The light outputting surface 51 is on a top of the LED die 50 and facing away from the substrate 10. The two electrodes 52 are formed on the bottom surface opposite the light outputting surface 51 and protrude downwards to the substrate 10. The two electrodes 52 on the bottom surface of the LED die 50 are connected to the electrodes 20 by anisotropic conductive paste 40. The anisotropic conductive paste 40 is a mixture of conductive particles 41 and adhering glue 42. The anisotropic conductive paste 40 has electrical conductivity in a single vertical direction and electrical insulation in a horizontal direction, because the conductive particles 41 contact each other in the vertical direction but spaced from each other by the adhering glue 42 in a horizontal direction.

The LED package 100 further includes a reflective cup 30. The reflective cup 30 is formed on the substrate 10 and surrounds the LED die 50. The reflective cup 30 is used for reflecting and converging the light radiated from the LED die 50 to enhance the light intensity.

A method for manufacturing the LED package 100 in accordance with the embodiment of the present disclosure includes steps of:

Step 1: providing a substrate 10 and forming a plurality of pairs of electrodes 20 on the substrate 10;

Step 2: positioning anisotropic conductive pastes 40 on the substrate 10 and attaching each anisotropic conductive paste 40 to each pair of the electrodes 20;

Step 3: positioning an LED die 50 on each anisotropic conductive paste 40 and electrically connecting each LED die 50 to each corresponding pair of the electrodes 20 with the anisotropic conductive paste 40 by compressing the LED die 50 toward the substrate 10 under a raised temperature which is about 200-250 degrees centigrade;

Step 4: forming an encapsulation 80 on the substrate 10 to cover the LED dies 50;

Step 5: cutting the substrate 10 to obtain individual LED packages 100.

Figure 2:
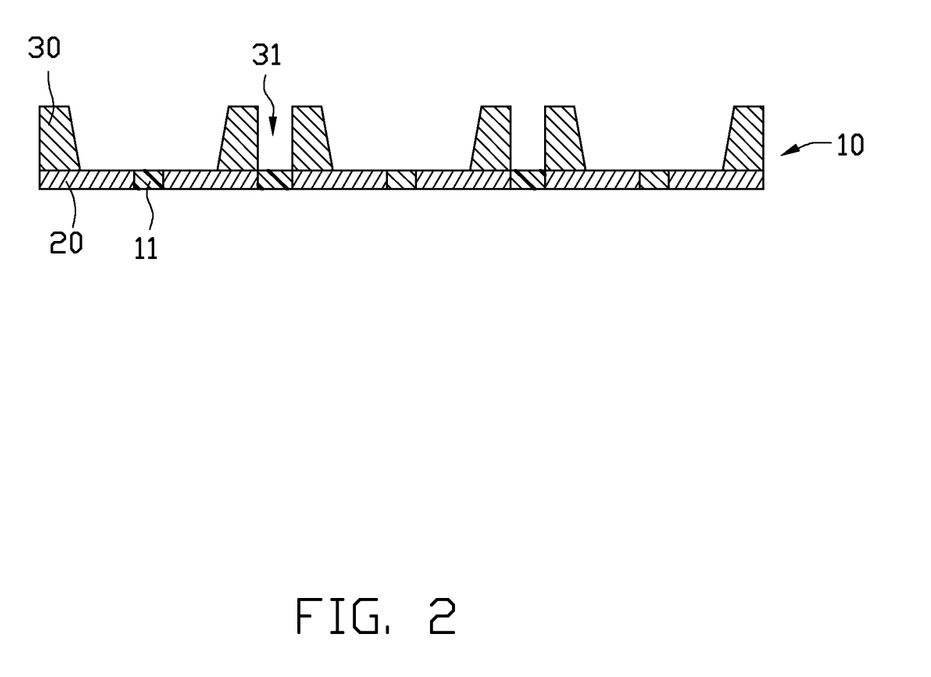
FIGS. 2, 3, 5-8 and 10-12 are schematic cross sections showing the LED package in accordance with the present disclosure processed by various steps of the LED packaging method of the present disclosure.

In step 1, referring to FIG. 2, the substrate 10 can be made of materials with excellent thermal conductivity and electrical insulation, such as ceramic. In this embodiment, the substrate 10 is rectangular and thin. The two electrodes 20 of each pair are spaced from each other to remain an electrically insulated area 11 therebetween. The electrodes 20 can be made by the following steps: forming a plurality of holes in the substrate 10; and then sputtering or filling the holes with metal. In this embodiment, the method for manufacturing the LED package 100 further includes a step of forming a plurality of reflective cups 30 on the substrate 10. Each reflective cup 30 surrounds a pair of electrodes 20. Further, each two adjacent reflective cups 30 are spaced from each other, defining a cutting passage 31 therebetween. The cutting passages 31 are used for defining spaces for cutting the substrate 10.

Figure 3:
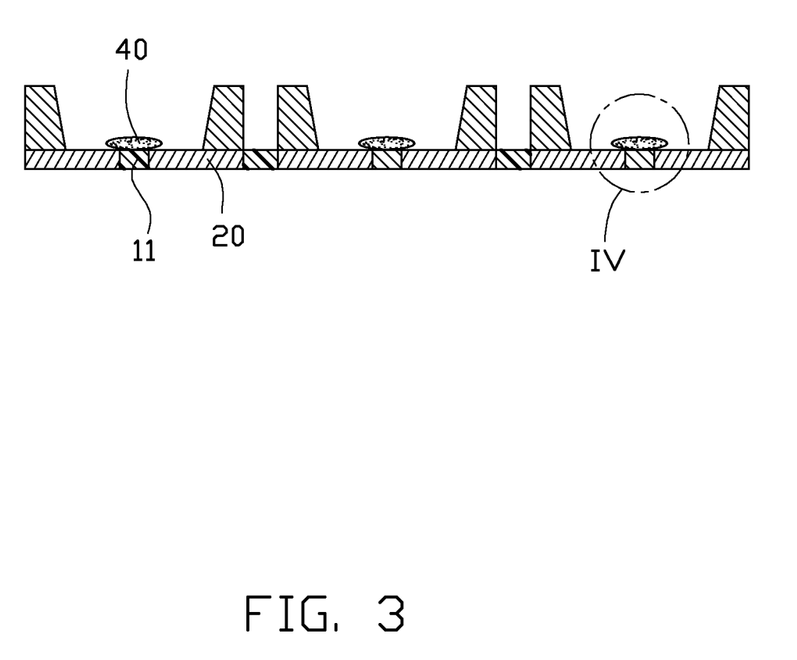
Figure 4:
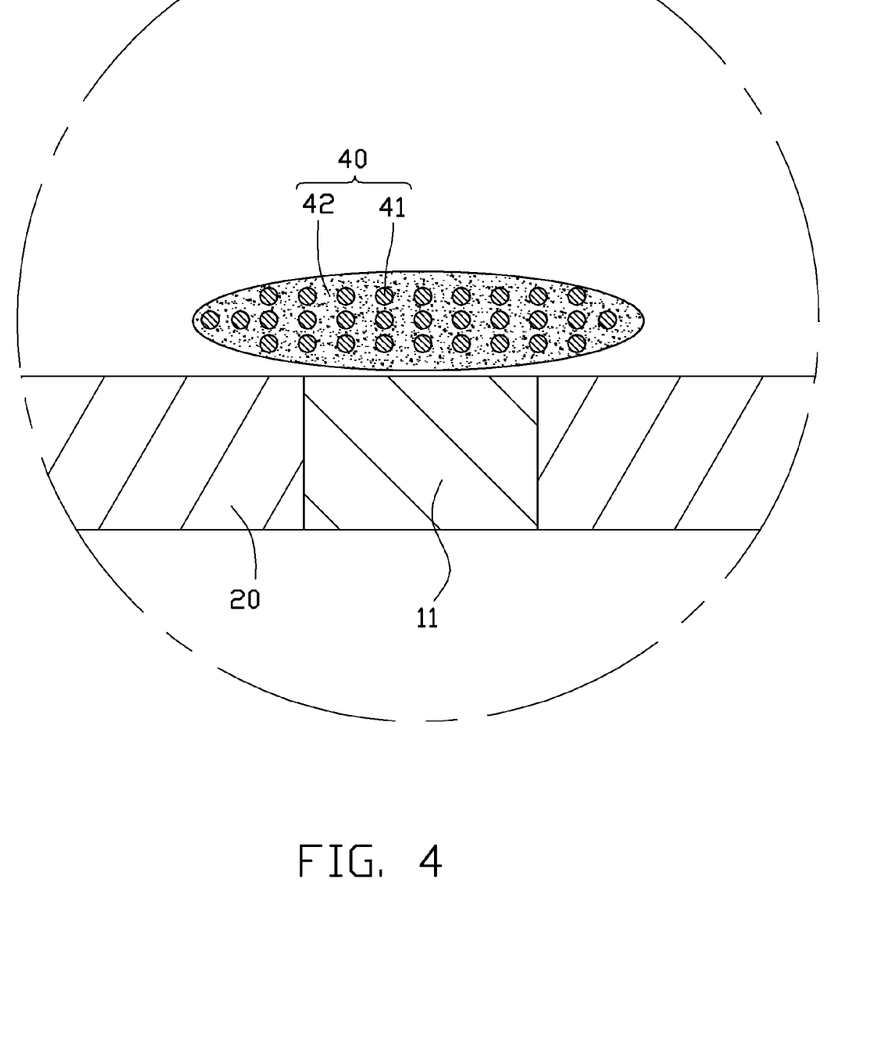
FIG. 4 is a partially enlarged view of a circled portion IV of the LED package of FIG. 3, obtained by a step before hot compressing process of the LED packaging method.

In step 2, referring to FIGS. 3 and 4, the anisotropic conductive paste 40 is insulated in both the vertical direction and the horizontal direction before the hot compressing process, because the conductive particles 41 are spaced from each other by the adhering glue 42 and do not contact each other in both the vertical direction and the horizontal direction. The anisotropic conductive paste 40 covers the insulated area 11 with two lateral sides attaching to each pair of the electrodes 20 in each reflective cup 30.

Figure 5:
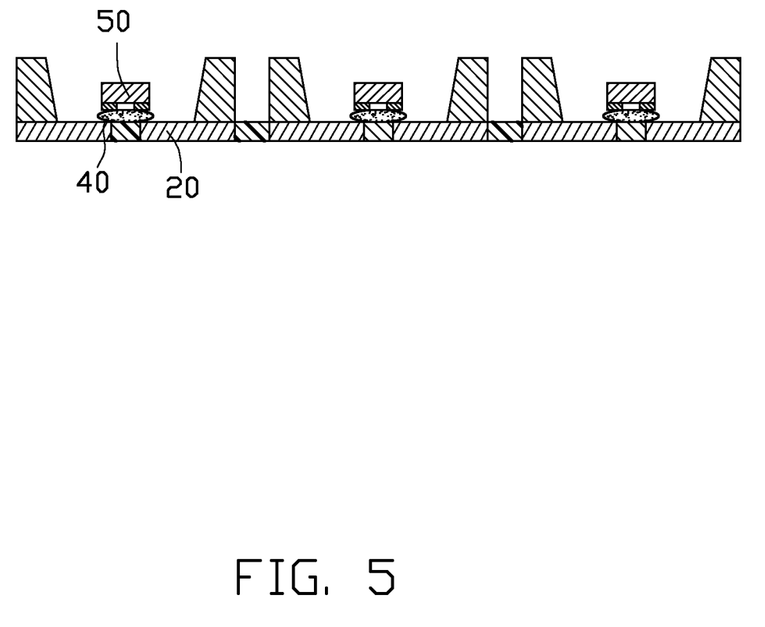
Figure 9:
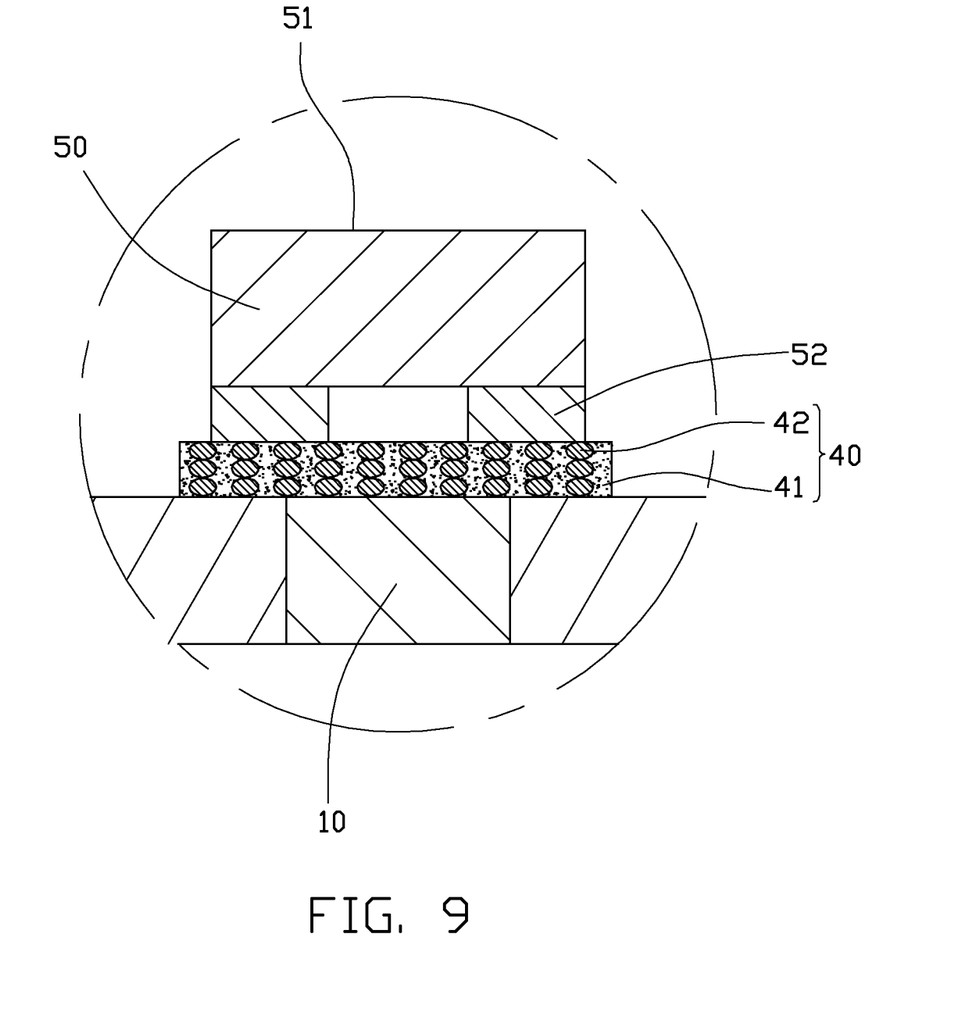
FIG. 9 is a partially enlarged view of a circled portion IX of the LED package of FIG. 8, obtained by step after the hot compressing process of the LED packaging method.

In step 3, referring to FIGS. 5 and 9, the light outputting surface 51 of the LED dies 50 faces away from the substrate 10. The two electrodes 52 of each LED die 50 are attached to the corresponding anisotropic conductive paste 40. The hot compressing process can be operated by the following steps.

Figure 6:
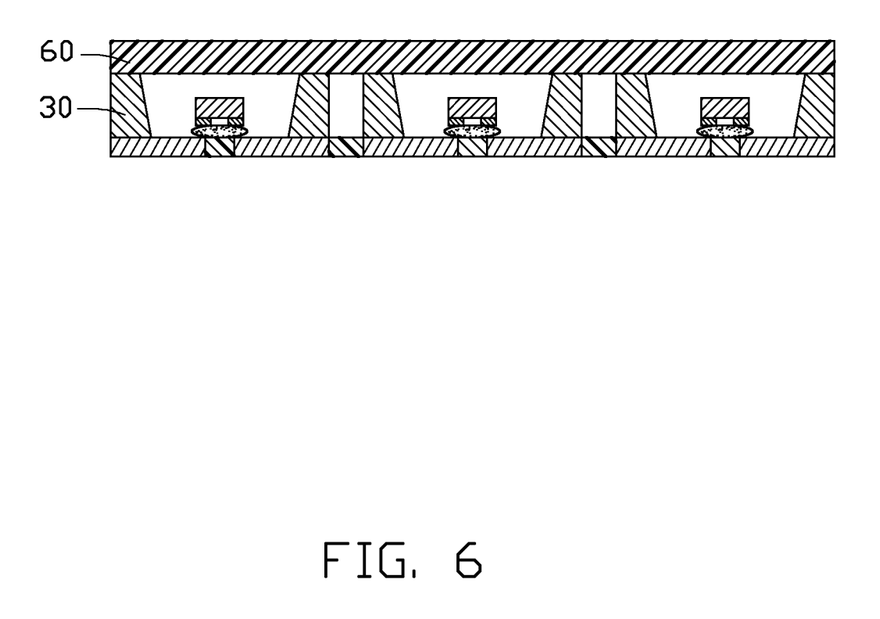

Referring to FIG. 6, a buffer layer 60 is arranged on tops of the reflective cups 30. The buffer layer 60 is made of polytetrafluoroethylene (PTFE) which is non-reactive and non-stick and has a low friction between 200 degrees centigrade to 250 degrees centigrade.

Figure 7:
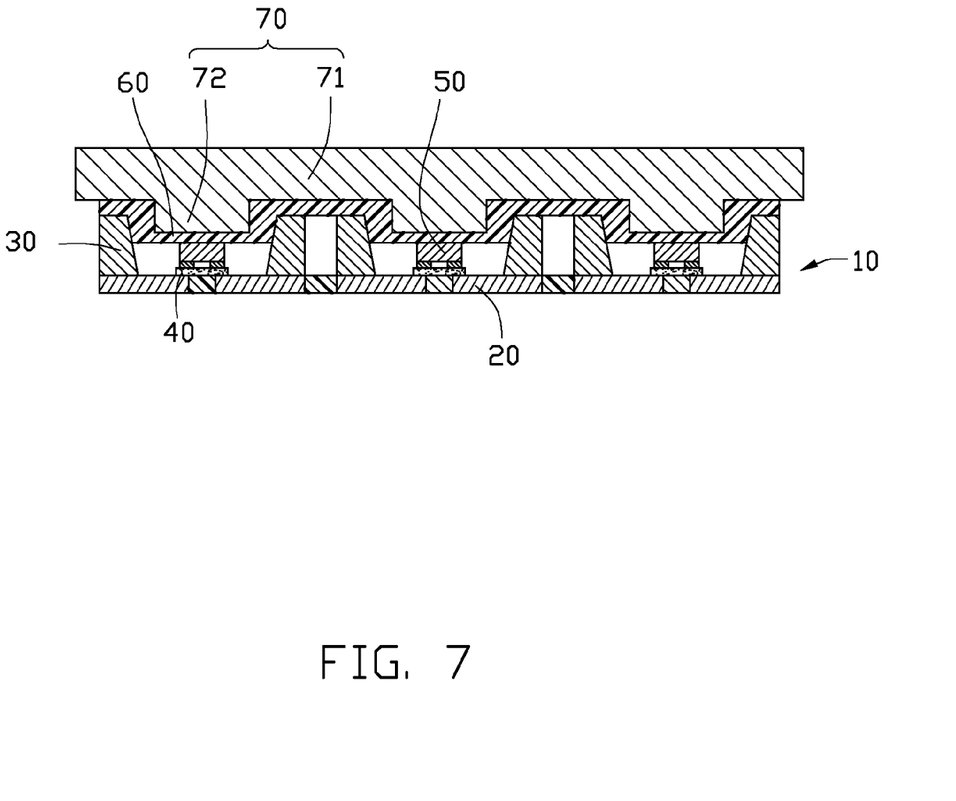

Referring to FIG. 7, the anisotropic conductive paste 40 is pressed to deform and electrically interconnect the LED die 50 and the electrodes 20 by a mold 70 under a predetermined temperature which is 200-250 degrees centigrade. The mold 70 includes a flat portion 71 and a plurality of blocks 72 extending downwardly from the flat portion 71. Each block 72 is corresponding to a reflective cup 30. In the hot compressing process, the mold 70 moves downwardly towards the substrate 10, with each block 72 pressing the buffer layer 60 into a corresponding reflective cup 30 until the buffer layer 60 engages the LED dies 50 and forces the LED dies 50 to press the anisotropic conductive paste 40 downwardly. The anisotropic conductive paste 40 is pressed to deform and electrically interconnect the LED dies 50 and the electrodes 20 by the hot compressing process.

Figure 8:
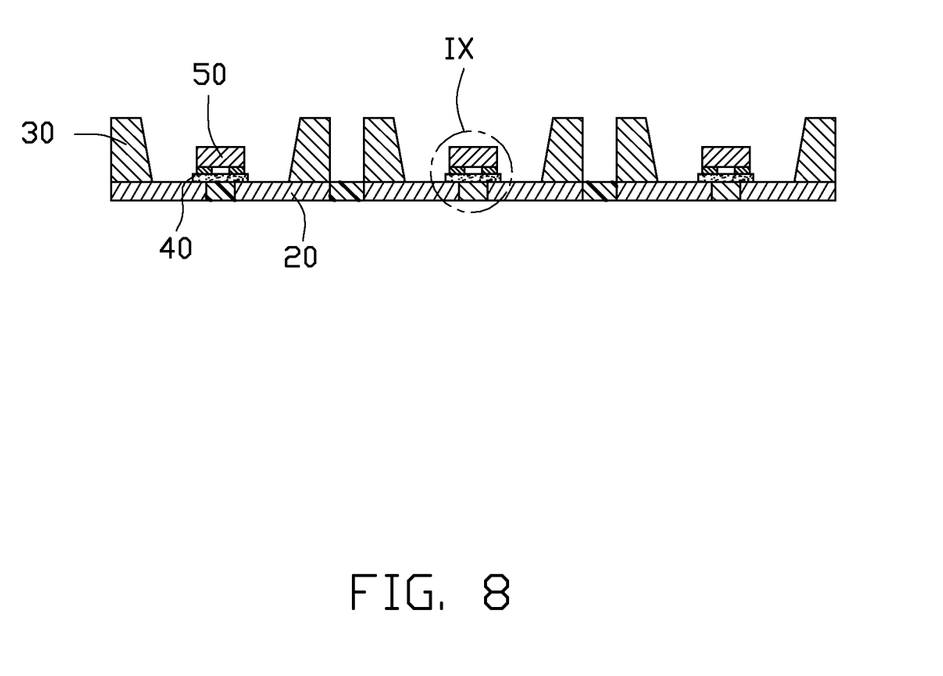

Referring to FIG. 8, the mold 70 and buffer layer 60 are removed. The buffer layer 60 is employed in the hot compressing process to protect the LED dies 50 from directly contacting and accordingly being damaged the mold 70. Further, the buffer layer 60 can provide even pressure for the anisotropic conductive paste 40 to avoid an uneven deformation of the anisotropic conductive paste 40, which will cause a bad electrical connection between the LED dies 50 and the electrodes 20.

In the above hot compressing process, the LED dies 50 apply a pressure towards the electrodes 20 via the anisotropic conductive paste 40, under a predetermined temperature between 200 and 250 centigrade degrees. Accordingly, the anisotropic conductive paste 40 is compressed vertically so that the conductive particles 41 are configured to contact each other in the vertical direction. Each conductive particle 41 is electrically insulated from a horizontal adjacent conductive particle 41 because the adhering glue 42 is distributed therebetween. As such, the anisotropic conductive paste 40 has an electrical conductivity in the single vertical direction In step 4, the encapsulation 80 includes phosphor powder distributed therein. In this embodiment, the encapsulation 80 is filled in the reflective cups 30 to obtain the LED package 100 as shown in FIG. 1. The encapsulation 80 can be formed by the following steps.

Figure 10:
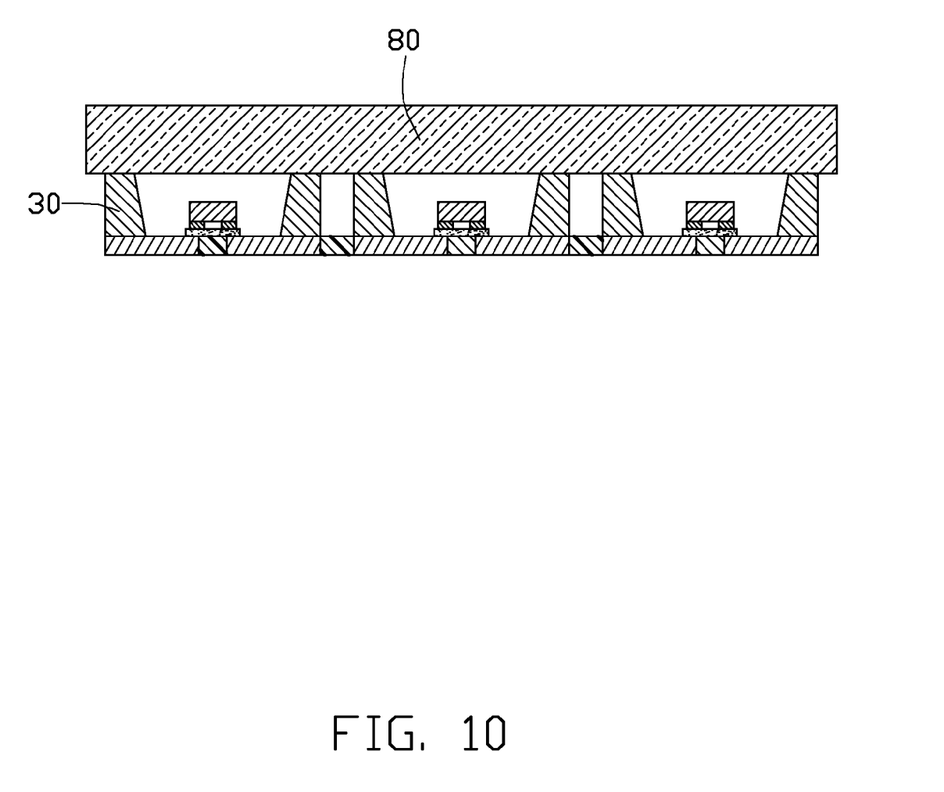

Referring to FIG. 10, the encapsulation 80 is positioned on top surfaces of the reflective cups 30. The encapsulation 80 has no liquidity so that the encapsulation 80 will not flow from the top surfaces of the reflective cups 30 into the reflective cups 30 in normal situation.

Figure 11:
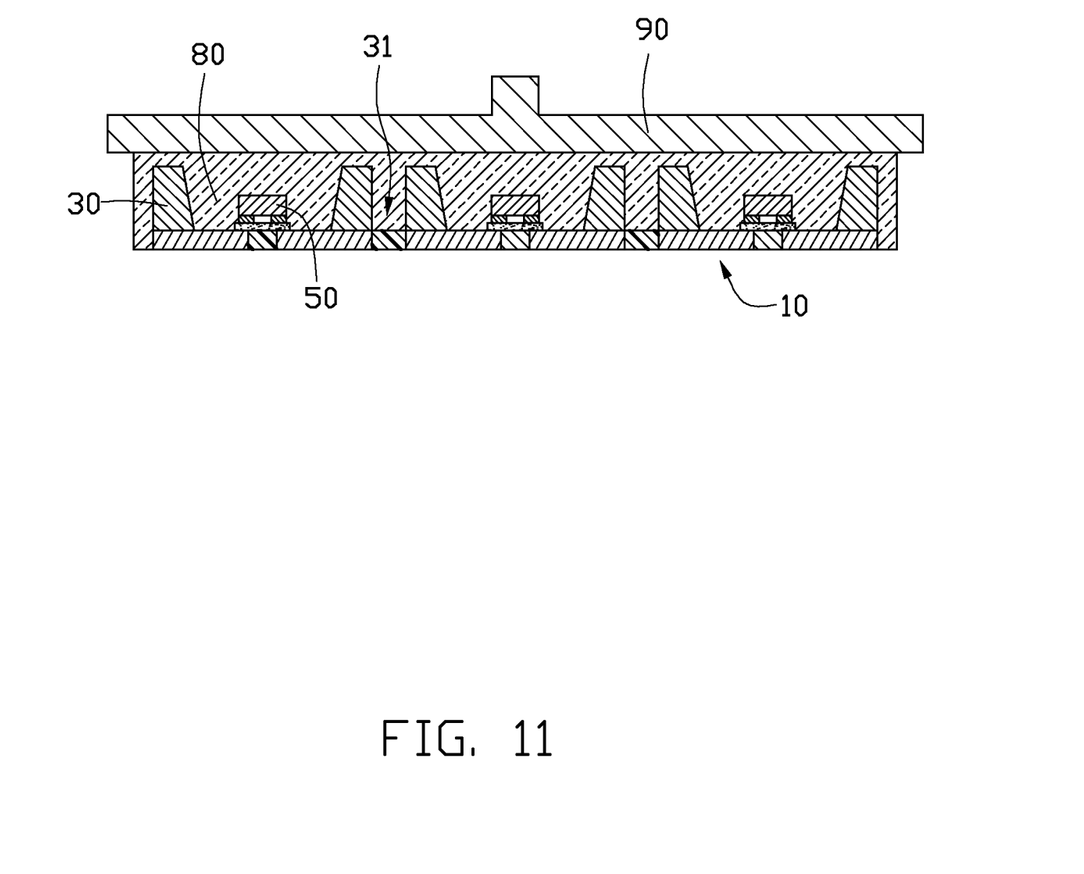

Referring to FIG. 11, the encapsulation 80 is pressed into the reflective cups 30. A second mold 90 is employed in the step. The second mold 90 is positioned above the encapsulation 80 and provides a downward pressure towards the encapsulation 80 until the encapsulation 80 fills up the reflective cups 30 and covers the LED dies 50 on the substrate 10. In this embodiment, the encapsulation 80 is pressed downward to fill up both the reflective cups 30 and the cutting passages 31. The encapsulation 80 covers the top surfaces and lateral sides of the reflective cups 30, thereby protecting the LED dies 50 from moisture and dust.

Figure 12:
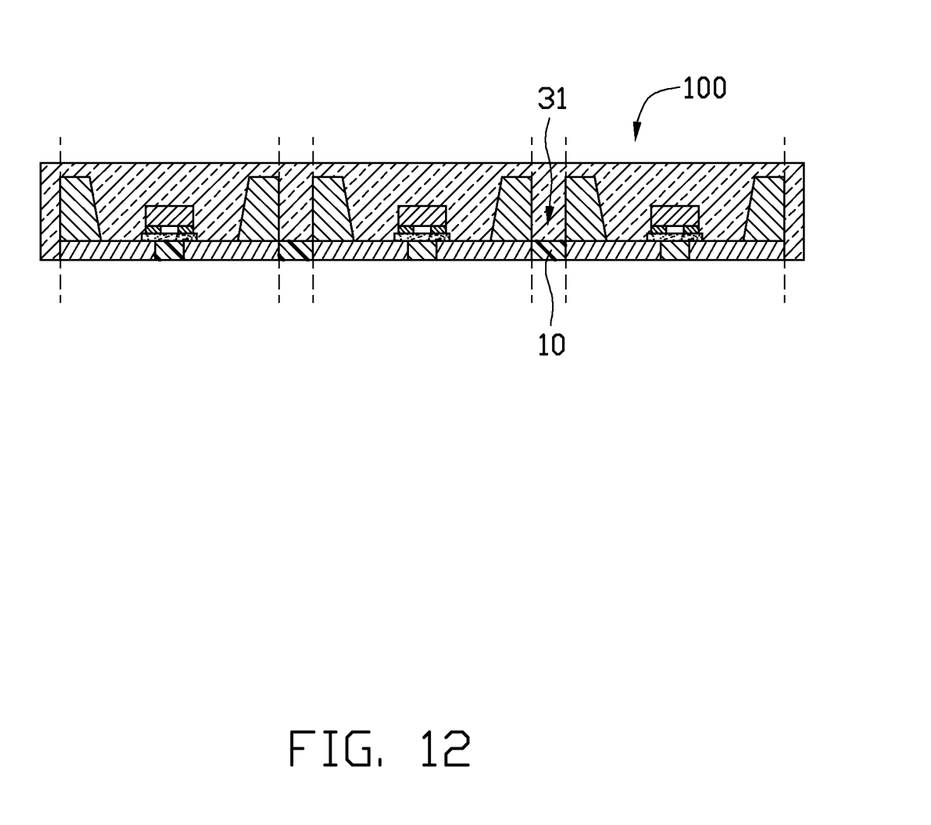

In step 5, referring to FIG. 12, the substrate 10 is cut along the cutting passages 31 to obtain individual LED packages 100, one of which is shown in FIG. 1.

In this process, the LED die 50 is electrically fixed on the electrodes 20 by the anisotropic conductive paste 40 by the hot compressing process, so that a welding operation of the two electrodes 52 of the LED die 50 is omitted, whereby a heat stress in the electrical connections of the two electrodes 52 of the LED die 50 and the electrodes 20 of the substrate 10 is avoided. The hot compressing process relating to the LED die 50 can be conveniently performed in the LED packaging. Further, the packaging process of the present disclosure can avoid using metal wires which are easily broken under a pressure of the encapsulation 80.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for manufacturing LED packages, comprising steps:
   providing a substrate and forming a plurality of pairs of electrodes on the substrate;
   forming a plurality of reflective cups on the substrate, each reflective cup surrounding a corresponding pair of the electrodes;
   positioning anisotropic conductive pastes on the substrate and attaching each anisotropic conductive paste to a corresponding pair of the electrodes;
   positioning an LED die on the each anisotropic conductive paste and electrically connecting the LED die to the corresponding pair of the electrodes with the each anisotropic conductive paste by compressing;
   forming an encapsulation on the substrate to cover the LED dies; and
   cutting the substrate to obtain individual LED packages each including a corresponding LED die;
   wherein the compressing process is operated by steps:
   arranging a buffer layer on the reflective cups;
   pressing the buffer layer with a mold and under a predetermined temperature into the reflective cuts to press the anisotropic conductive pastes to deform and electrically interconnect the LED dies and the electrodes; and
   removing the mold and the buffer layer.

2. The method of claim 1, wherein each two adjacent reflective cups are spaced from each other with a cutting passage defined therebetween.

3. The method of claim 1, wherein the each anisotropic conductive paste is a mixture of conductive particles and adhering glue, and the conductive particles are spaced from each other before the step of pressing the anisotropic conductive paste to deform and electrically interconnect the LED dies and the electrodes.

4. The method of claim 3, wherein the conductive particles contact each other in a vertical direction after the step of pressing the anisotropic conductive pastes to deform and electrically interconnect the LED dies and the electrodes.

5. The method of claim 1, wherein the buffer layer is made of polytetrafluoroethylene (PTFE).

6. The method of claim 1, wherein the mold comprises a plurality of blocks corresponding to the reflective cups, and each block presses into a corresponding reflective cup and presses the buffer layer into the corresponding reflective cup.

7. The method of claim 1, wherein the predetermined temperature is between 200 and 250 centigrade degrees.

8. The method of claim 1, wherein each two electrodes are spaced from each other in each pair of the electrodes, and an electrically insulated area is defined between the two electrodes.

9. The method of claim 8, wherein the each anisotropic conductive paste covers the insulated area with two lateral sides of the each anisotropic conductive paste attaching to each pair of the electrodes.

10. The method of claim 9, wherein each LED die comprises two electrodes facing the substrate, and the two electrodes of each LED die are attached to the each anisotropic conductive paste.

11. A method for manufacturing LED packages, comprising steps:

providing a substrate and forming a plurality of pairs of electrodes on the substrate;

forming a plurality of reflective cups on the substrate, each reflective cup surrounding a corresponding pair of the electrodes;

positioning anisotropic conductive pastes on the substrate and attaching each anisotropic conductive paste to a corresponding pair of the electrodes;

positioning an LED die on the each anisotropic conductive paste and electrically connecting the LED die to the corresponding pair of the electrodes with the each anisotropic conductive paste by compressing;

forming an encapsulation on the substrate to cover the LED dies; and cutting the substrate to obtain individual LED packages each including a corresponding LED die;

wherein the step of forming an encapsulation on the substrate to cover the LED dies comprises steps:

positioning the encapsulation on top surfaces of the reflective cups; and pressing the encapsulation into the reflective cups.

12. The method of claim 11, wherein a second mold is positioned above the encapsulation and provides a downward pressure to the encapsulation until the encapsulation fills up the reflective cups and covers the LED dies on the substrate.

13. The method of claim 12, wherein the encapsulation is pressed downward to fill up both the reflective cups and the cutting passages.

14. The method of claim 13, wherein the encapsulation covers the top surfaces and lateral sides of the reflective cups.

* * * * *